(12) United States Patent
Morikazu (10) Patent No.: US 7,919,395 B2
(45) Date of Patent: Apr. 5, 2011

(54) METHOD FOR SEPARATING WAFER USING TWO LASER BEAMS (75) Inventor: Hiroshi Morikazu, Ota-Ku (JP)

(73) Assignee: Disco Corporation, Tokyo (JP)

( * ) Notice: Subject to any disclaimer, the term of this patent is extended or adjusted under 35 U.S.C. 154(b) by 193 days.

(21) Appl. No.: 12/110,839

(22) Filed: Apr. 28, 2008

(65) Prior Publication Data

US 2008/0299745 A1    Dec. 4, 2008

(30) Foreign Application Priority Data

May 30, 2007 (JP) ................. 2007-142887

(51) Int. Cl.
*H01L 21/00* (2006.01)
(52) U.S. Cl. .................... 438/463; 438/460; 438/462
(58) Field of Classification Search .......... 438/460, 438/462, 463
See application file for complete search history.

(56) References Cited

U.S. PATENT DOCUMENTS

2006/0073676 A1* 4/2006 Chen et al. ............ 438/460
2006/0249816 A1* 11/2006 Li et al. ................ 257/618
2008/0135975 A1* 6/2008 Haraguchi et al. ......... 257/499

FOREIGN PATENT DOCUMENTS

JP    A 2005-142389    6/2005

* cited by examiner

*Primary Examiner* — Thanh V Pham
*Assistant Examiner* — Caleb Henry
(74) *Attorney, Agent, or Firm* — Greer, Burns & Crain, Ltd.

(57) ABSTRACT

A wafer separating method including a laminated member removing step for partially removing a laminated member of a wafer along streets by applying a laser beam to the wafer along the streets, and a cutting step for cutting a substrate of the wafer along the streets after the laminated member removing step. The laminated member removing step includes a first laser processing step for applying a first laser beam along two parallel lines spaced apart from each other in each street, the first laser beam being capable of passing through the laminated member and having an absorption wavelength to the substrate, thereby heating the substrate to generate two cracks in the laminated member by thermal shock so that the two cracks extend along the two parallel lines in each street; and a second laser processing step for applying a second laser beam to a region between the two cracks in the laminated member, the second laser beam having an energy density higher than that of the first laser beam, thereby removing the region between the two cracks in the laminated member to expose the substrate along each street.

6 Claims, 10 Drawing Sheets

METHOD FOR SEPARATING WAFER USING TWO LASER BEAMS

BACKGROUND OF THE INVENTION

1. Field of the Invention

The present invention relates to a wafer separating method for separating a wafer along a plurality of streets to obtain a plurality of individual devices, wherein the wafer is composed of a substrate and a laminated member formed on the substrate, and the laminated member is composed of an insulating film and a functional film laminated on the insulating film.

2. Description of the Related Art

As well known in the art, a semiconductor wafer having a plurality of devices such as ICs and LSIs arranged like a matrix on the upper surface of a substrate such as a silicon substrate is fabricated in a semiconductor device fabrication process, wherein each device is formed by a laminated member composed of an insulating film and a functional film laminated on the insulating film. In such a semiconductor wafer, the plural devices are partitioned from each other by a plurality of separation lines called streets preliminarily formed on the upper surface of the semiconductor wafer, and the semiconductor wafer is separated along these streets to obtain the individual devices.

The separation of the semiconductor wafer along the streets is usually performed by using a cutting unit called a dicer. The cutting unit includes a chuck table for holding a semiconductor wafer as a workpiece, cutting means for cutting the semiconductor wafer held on the chuck table, and moving means for relatively moving the chuck table and the cutting means. The cutting means includes a rotating spindle adapted to be rotated at a high speed and a cutting blade mounted on the spindle. The cutting blade is composed of a disk-shaped base and an annular cutting member mounted on the outer circumferential portion of a side surface of the base. The cutting member is formed by fixing diamond abrasive grains having a grain size of about 3 µm by electroforming, for example.

In recent years, a semiconductor wafer including a substrate such as a silicon substrate and a laminated member formed on the substrate for forming a plurality of devices such as ICs and LSIs has been put into practical use, wherein the laminated member is composed of a low-permittivity insulating film (Low-k film) formed of a vitreous material such as SiO2, SiO, and SiN and a functional film for forming circuitry, thereby improving the performance of each device.

The material of the Low-k film is different from the material of the substrate, so that it is difficult to simultaneously cut the Low-k film and the substrate by using the cutting blade. More specifically, the Low-k film is very brittle like mica, so that if the wafer is cut along each street by the cutting blade, there arises a problem such that the Low-k film may be peeled and such peeling may reach the circuitry in the functional film to cause a fatal damage to each device.

A wafer separating method intended to solve this problem is disclosed in Japanese Patent Laid-Open No. 2005-142389. This wafer separating method includes the steps of forming two laser cut grooves along each street formed on a semiconductor wafer to split a laminated member composed of an insulating film and a functional film and next positioning a cutting blade between the two laser cut grooves to relatively move the cutting blade and the semiconductor wafer, thereby cutting the semiconductor wafer along each street.

In this wafer separating method, a pulsed laser beam is applied along each street on the semiconductor wafer to melt and vaporize the laminated member along each street, thereby forming each laser cut groove. However, strain due to the laser processing remains on both sides of each laser cut groove, causing a reduction in die strength of each device separated from the semiconductor wafer.

SUMMARY OF THE INVENTION

It is therefore an object of the present invention to provide a wafer separating method for separating a wafer along a plurality of streets to obtain a plurality of individual devices, the wafer being composed of a substrate such as a silicon substrate and a laminated member formed on the substrate, the laminated member being composed of an insulating film and a functional film laminated on the insulating film, wherein the wafer can be separated without peeling of the laminated member and a reduction in die strength.

In accordance with an aspect of the present invention, there is provided a wafer separating method for separating a wafer along a plurality of streets to obtain a plurality of individual devices, the wafer being composed of a substrate and a laminated member formed on the substrate, the laminated member being composed of an insulating film and a functional film laminated on the insulating film, the wafer separating method comprising a laminated member removing step for partially removing the laminated member along the streets by applying a laser beam to the wafer along the streets; and a cutting step for cutting the substrate along the streets after the laminated member removing step; the laminated member removing step comprising a first laser processing step for applying a first laser beam along two parallel lines spaced apart from each other in each street, the first laser beam being capable of passing through the laminated member and having an absorption wavelength corresponding to the substrate, thereby heating the substrate to generate two cracks in the laminated member by thermal shock so that the two cracks extend along the two parallel lines in each street; and a second laser processing step for applying a second laser beam to a region between the two cracks in the laminated member, the second laser beam having an energy density higher than that of the first laser beam, thereby removing the region between the two cracks in the laminated member to expose the substrate along each street.

Preferably, the insulating film is formed of a vitreous material selected from the group consisting of SiO2, SiO, and SiN; the substrate is formed of Si or GaAs; and the wavelength of the first laser beam is set to 355 nm. Preferably, the energy intensity of the first laser beam is set to 7 to 8 J/cm$^2$, and the energy intensity of the second laser beam is set to 14 to 16 J/cm$^2$.

Preferably, the cutting step uses a cutting blade having a thickness smaller than the width of an exposed portion of the substrate exposed along each street by the second laser processing step, whereby the exposed portion of the substrate is cut by the cutting blade along each street. Alternatively, the cutting step uses a third laser beam having an energy intensity higher than that of the second laser beam, the third laser beam being applied to an exposed portion of the substrate exposed along each street by the second laser processing step, whereby the exposed portion of the substrate is cut by the third laser beam along each street. In this case, the energy intensity of the third laser beam is set to 24 to 26 J/cm$^2$.

As described above, the laminated member removing step in the wafer separating method according to the present invention is performed to partially remove the laminated member along the streets by applying a laser beam to the wafer along the streets. In the first laser processing step of the laminated member removing step, the first laser beam capable of passing through the laminated member and having an absorption wavelength to the substrate is applied along the two parallel lines spaced apart from each other in each street, thereby heating the substrate to generate the two cracks in the laminated member by thermal shock so that the two cracks extend along the two parallel lines in each street. In the second laser processing step of the laminated member removing step, the second laser beam having an energy density higher than that of the first laser beam is applied to the region between the two cracks in the laminated member, thereby removing the region between the two cracks in the laminated member to expose the substrate along each street. The above region in the laminated member to be removed in the second laser processing step is cleaved along the two cracks in each street, so that no laser processing strain remains in the cleavage plane of the laminated member. Accordingly, in each device obtained by this wafer separating method, no laser processing strain remains in the laminated member and the die strength of each device is not reduced.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
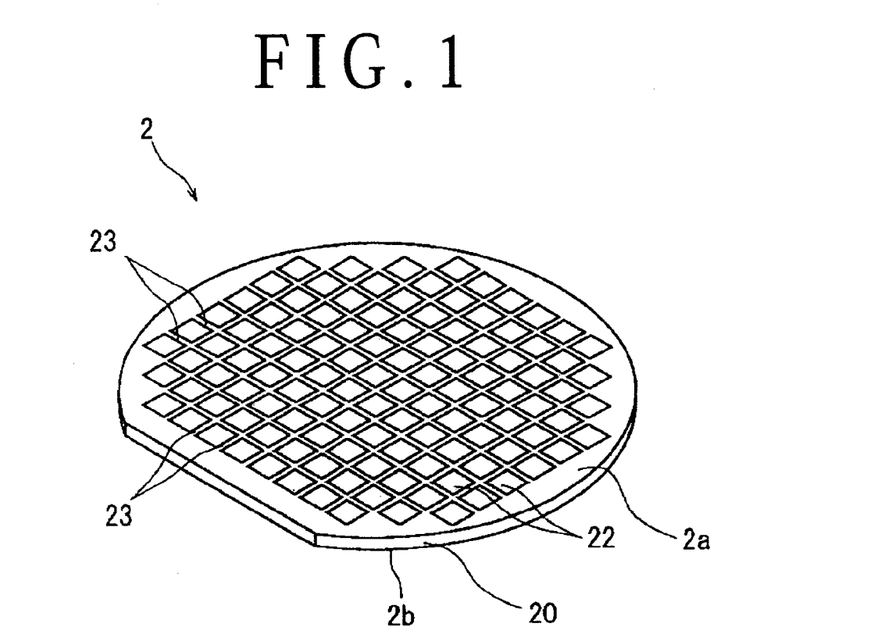
FIG. 1 is a perspective view showing a semiconductor wafer as a wafer to be separated by the wafer separating method according to the present invention.
Figure 2:
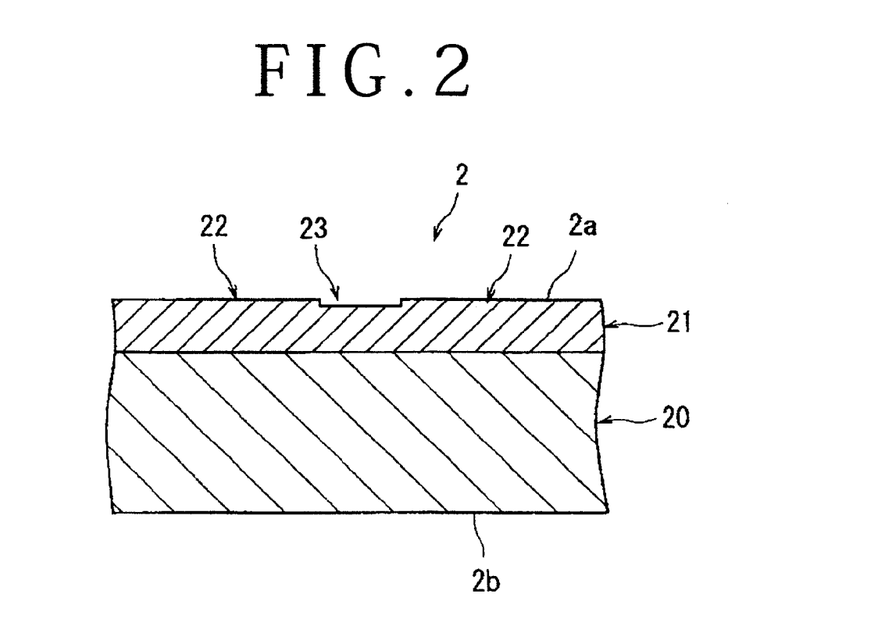
FIG. 2 is an enlarged sectional view of the semiconductor wafer shown in FIG. 1.

There will now be described a wafer separating method according to a preferred embodiment of the present invention with reference to the attached drawings. FIG. 1 is a perspective view of a semiconductor wafer 2 as a wafer to be separated into a plurality of individual devices by the wafer separating method according to the preferred embodiment, and FIG. 2 is an enlarged sectional view of an essential part of the semiconductor wafer 2. As shown in FIGS. 1 and 2, the semiconductor wafer 2 has an upper surface 2a and a lower surface 2b. The semiconductor wafer 2 is composed of a substrate 20 such as a silicon substrate and a laminated member 21 formed on the upper surface of the substrate 20. The laminated member 21 is composed of an insulating film and a functional film laminated on the insulating film. The functional film forms circuitry. A plurality of devices 22 such as ICs and LSIs are formed by the laminated member 21 so as to be partitioned by a plurality of crossing streets 23 formed on the upper surface 2a of the semiconductor wafer 2. Accordingly, the plural devices 22 are arranged like a matrix. In this preferred embodiment, the substrate 20 is formed of Si or GaAs and has a thickness of 60 μm, for example. The laminated member 21 has a thickness of 2 to 10 μm, for example, and the insulating film constituting the laminated member 21 is a low-permittivity insulating film (Low-k film) formed of a vitreous material such as $SiO_2$, SiO, and SiN.

Figure 3:
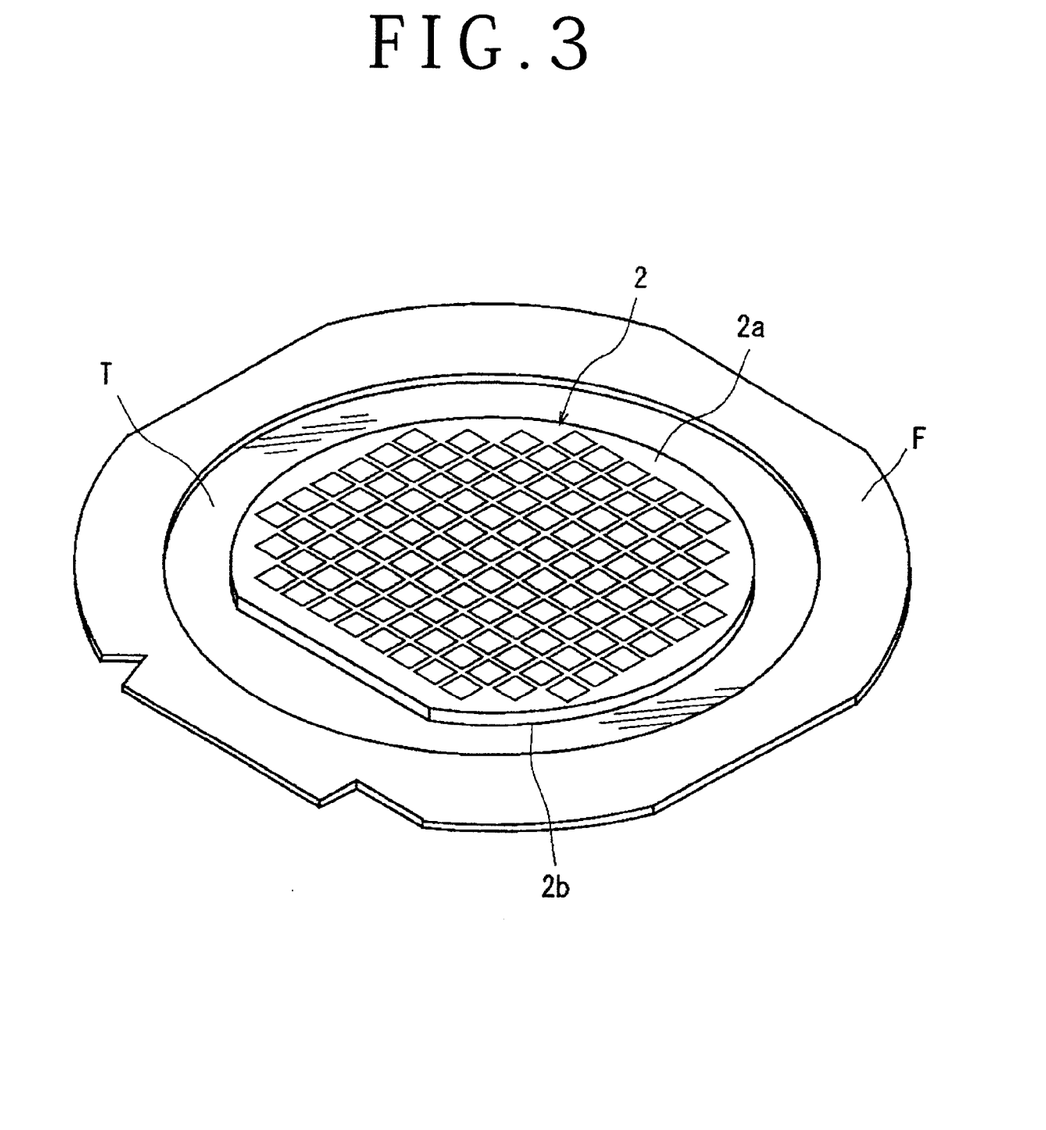
FIG. 3 is a perspective view showing a condition where the semiconductor wafer shown in FIG. 1 is supported through a dicing tape to an annular frame.

Before separating the semiconductor wafer 2 along the streets 23, the semiconductor wafer 2 is attached to the upper surface of a dicing tape T mounted on an annular frame F as shown in FIG. 3. More specifically, the lower surface 2 of the semiconductor wafer 2 is attached to the upper surface of the dicing tape T, so that the upper surface 2a of the semiconductor wafer 2 is exposed.

In such a supported condition that the semiconductor wafer 2 is supported through the dicing tape T to the frame F, a laminated member removing step is performed to partially remove the laminated member 21 along the streets 23 by applying a laser beam to the upper surface 2a of the semiconductor wafer 2 along the streets 23. The laminated member removing step includes a first laser processing step for applying a first laser beam along two parallel lines spaced apart from each other in each street 23, said first laser beam being capable of passing through said laminated member 21 and having an absorption wavelength corresponding to said substrate 20, thereby heating said substrate 20 to generate two cracks in said laminated member 21 by thermal shock so that said two cracks extend along said two parallel lines in each street 23; and a second laser processing step for applying a second laser beam to a region between said two cracks in said laminated member 21, said second laser beam having an energy intensity higher than that of said first laser beam, thereby removing said region between said two cracks in said laminated member 21 to expose said substrate 20 along each street 23.

Figure 4:
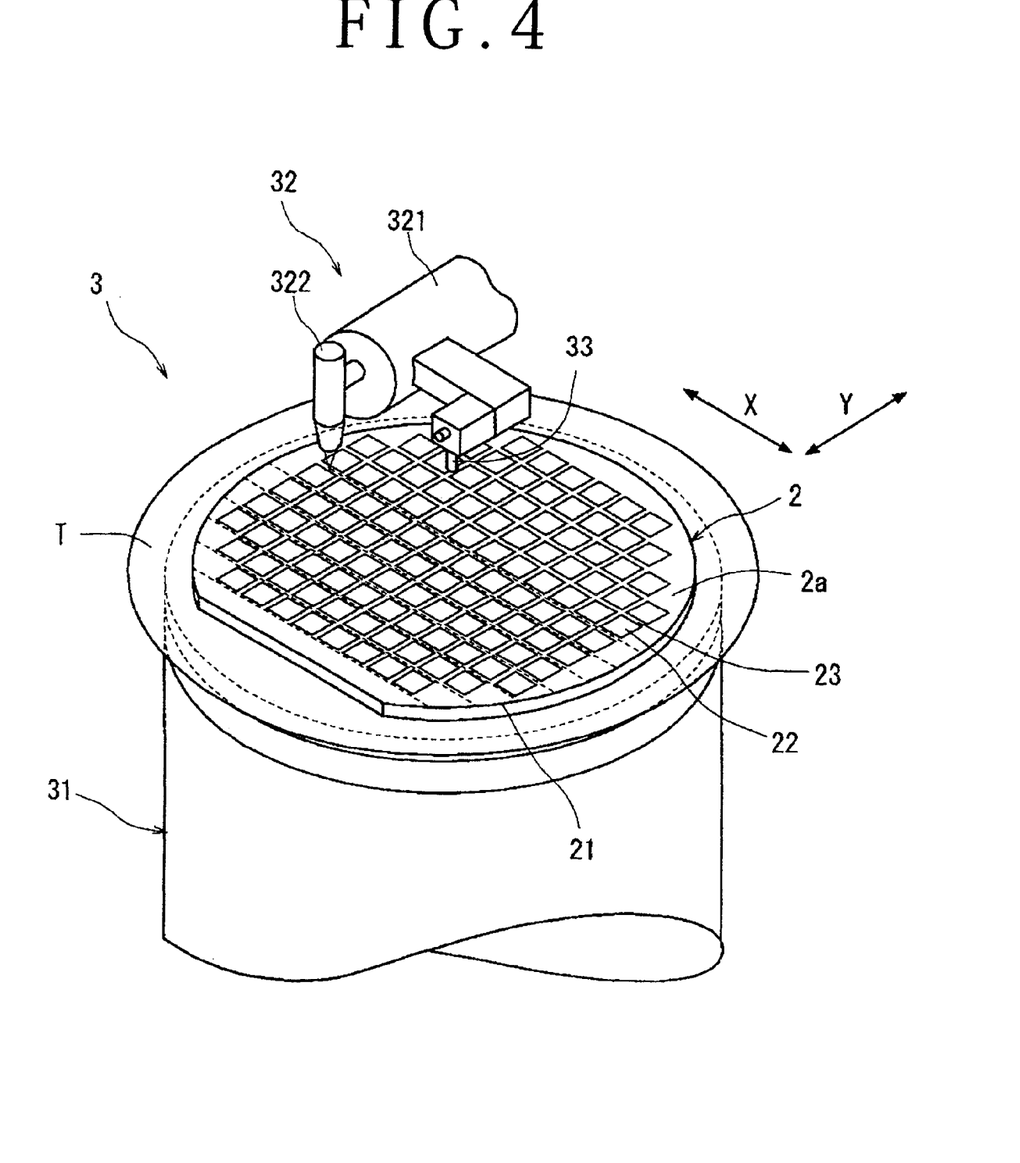
FIG. 4 is a perspective view of an essential part of a laser processing unit for performing a laminated member removing step in the wafer separating method according to the present invention.

This laminated member removing step including the first and second laser processing steps is performed by using a laser processing unit 3 shown in FIG. 4. As shown in FIG. 4, the laser processing unit 3 includes a chuck table 31 for holding a workpiece, laser beam applying means 32 for applying a laser beam to the workpiece held on the chuck table 31, and imaging means 33 for imaging the workpiece held on the chuck table 31. The chuck table 31 is so configured as to hold the workpiece by using suction means (not shown). The chuck table 31 is movable in a work feed direction shown by an arrow X and an index direction shown by an arrow Y by means of a moving mechanism (not shown).

The laser beam applying means 32 includes a cylindrical casing 321 extending in a substantially horizontal direction. Although not shown, the casing 321 contains pulsed laser beam oscillating means including a pulsed laser beam oscillator and repetition frequency setting means. Examples of the pulsed laser beam oscillator include a YAG laser oscillator and a YVO4 laser oscillator. The laser beam applying means 32 further includes focusing means 322 mounted on the front end of the casing 321 for focusing the pulsed laser beam oscillated from the pulsed laser be am oscillating means.

The imaging means 33 is provided at the front end portion of the casing 321 of the laser beam applying means 32. The imaging means 33 includes illuminating means for illuminating the workpiece, an optical system for forming an image in a region illuminated by the illuminating means, and an imaging device (CCD) for generating an image signal from the image formed by the optical system. The image signal output from the imaging means 33 is transmitted to control means (not shown).

The first laser processing step in the laminated member removing step to be performed by using the laser processing unit 3 will now be described with reference to FIGS. 4 to 6B. First, the semiconductor wafer 2 is placed on the chuck table 31 of the laser processing unit 3 shown in FIG. 4. Thereafter, the suction means (not shown) is operated to hold the semiconductor wafer 2 on the chuck table 31 by vacuum. In this condition, the dicing tape T to which the lower surface 2 of the semiconductor wafer 2 is attached is placed on the chuck table 31. Accordingly, the semiconductor wafer 2 is held on the chuck table 31 in the condition where the upper surface 2a is exposed. In FIG. 4, the annular frame F for supporting the dicing tape T is not shown. Although not shown, the annular frame F is supported by suitable frame supporting means provided on the chuck table 31.

The chuck table 31 thus holding the semiconductor wafer 2 is moved to a position directly below the imaging means 33 by work feeding means (not shown). When the chuck table 31 is positioned directly below the imaging means 33, an alignment operation is performed by the imaging means 33 and the control means (not shown) to detect a subject area of the semiconductor wafer 2 to be laser-processed. More specifically, the imaging means 33 and the control means (not shown) perform image processing such as pattern matching for making the alignment of the streets 23 extending in a predetermined direction on the semiconductor wafer 2 and the focusing means or condensing means 322 of the laser beam applying means 32 for applying the laser beam to the semiconductor wafer 2 along the streets 23, thus performing the alignment of a laser beam applying position. Similarly, the alignment of a laser beam applying position is performed for the other streets 23 extending in a direction perpendicular to the above-mentioned predetermined direction on the semiconductor wafer 2.

Figure 5A:
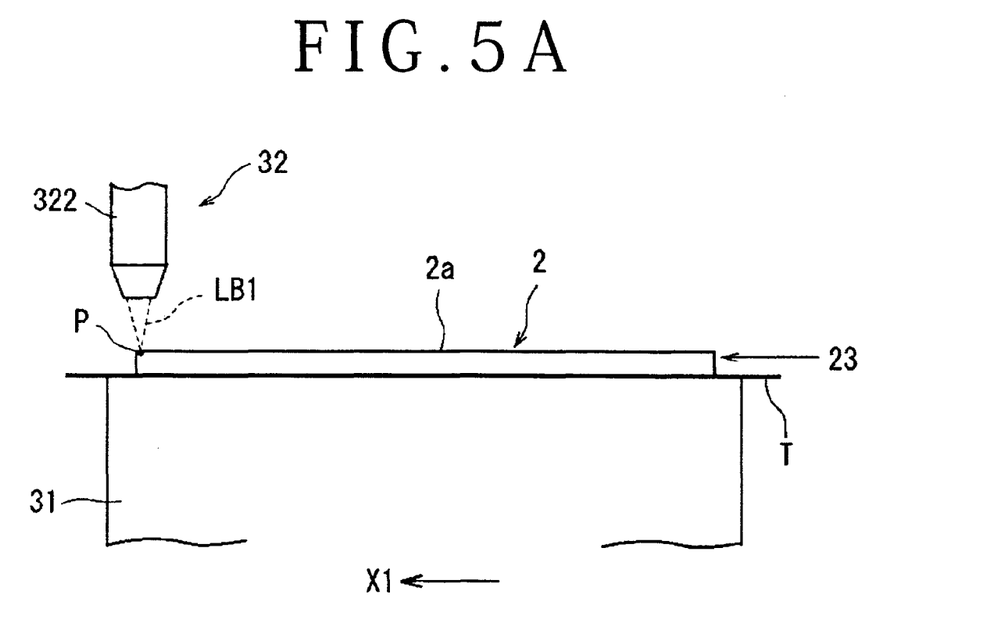
FIGS. 5A and 5B are elevational views showing a first laser processing step of the laminated member removing step.
Figure 5B:
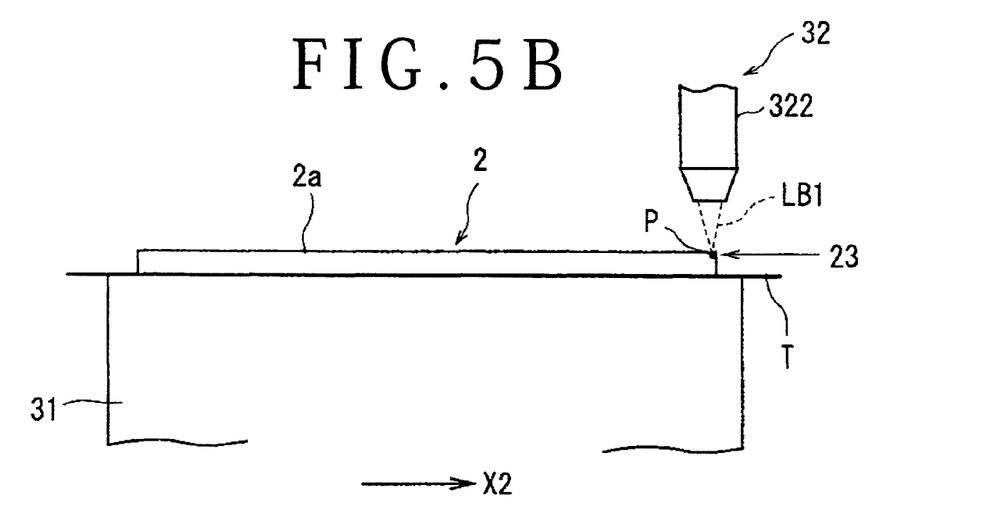
Figure 6A:
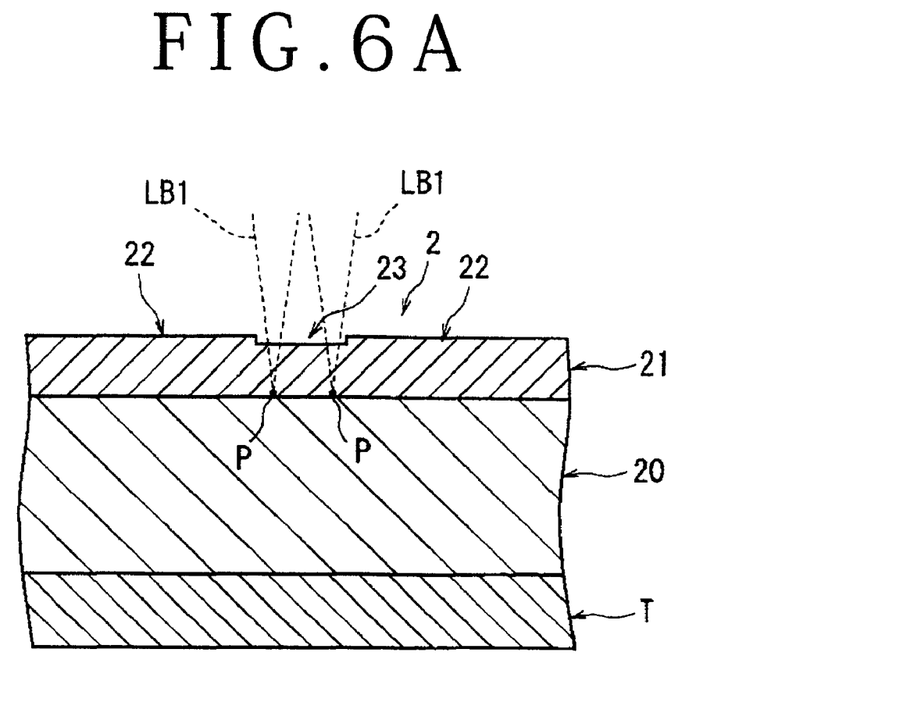
FIGS. 6A and 6B are enlarged sectional views of the wafer for illustrating the first laser processing step shown in FIGS. 5A and 5B.

After detecting the streets 23 of the semiconductor wafer 2 held on the chuck table 31 to perform the alignment of a laser beam applying position as mentioned above, the chuck table 31 is moved to a laser beam applying area where the focusing means 322 of the laser beam applying means 32 is located as shown in FIG. 5A, thereby positioning a predetermined one of the streets 23 directly below the focusing means 322. More specifically, one end of a predetermined one of the streets 23 (left end as viewed in FIG. 5A) is positioned directly below the focusing means 322 as shown in FIG. 5A. In this condition, a pulsed laser beam LB1 as the first laser beam capable of passing through the laminated member 21 and having an absorption wavelength corresponding to the substrate 20 is applied from the focusing means 322 of the laser beam applying means 32 to the semiconductor wafer 2, and the chuck table 31 is moved in a direction shown by an arrow X1 in FIG. 5A at a predetermined feed speed, so that the pulsed laser beam LB1 is relatively moved along the predetermined street 23 from one end to the other end thereof. When the other end of the predetermined street 23 (right end as viewed in FIG. 5B) reaches a position directly below the focusing means 322 as shown in FIG. 5B, the application of the pulsed laser beam LB1 is stopped and the movement of the chuck table 31 is also stopped. In the first laser processing step, the focal point P of the pulsed laser beam LB1 is adjusted near the upper surface of the substrate 20 as shown in FIG. 6A.

Thereafter, the chuck table 31 is moved in a direction perpendicular to the plane of the sheet of FIG. 5B (i.e., in the index direction perpendicular to the work feed direction) by about 30 to 40 µm as the predetermined spacing between the two parallel lines in each street 23 as mentioned above. Thereafter, the pulsed laser beam LB1 is applied from the focusing means 322 of the laser beam applying means 32 to the semiconductor wafer 2, and the chuck table 31 is moved in a direction shown by an arrow X2 in FIG. 5B at a predetermined feed speed, so that the pulsed laser beam LB1 is relatively moved along the predetermined street 23 from the other end to one end thereof. When one end of the predetermined street 23 reaches a position directly below the focusing means 322 as shown in FIG. 5A, the application of the pulsed laser beam LB1 is stopped and the movement of the chuck table 31 is also stopped.

For example, the first laser processing step mentioned above is performed under the following conditions.

| | |
|---|---|
| Light source of laser beam: | YAG Laser |
| Wavelength: | 355 nm |
| Average power: | 1.5 W |
| Energy intensity per pulse: | 7 to 8 J/cm$^2$ |
| Repetition frequency: | 100 kHz |
| Focused spot (elliptical shape): | |
| Major axis: | 20 µm |
| Minor axis: | 10 µm |
| Work feed speed: | 200 mm/sec |

Figure 6B:
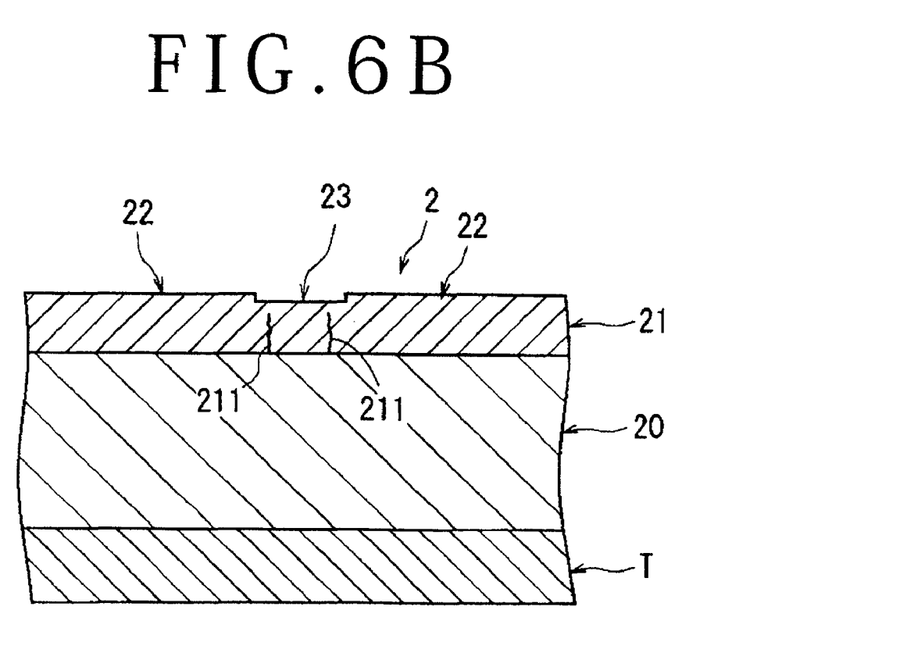

By performing the first laser processing step, the substrate 20 of the semiconductor wafer 2 is heated near the focal points P of the pulsed laser beams LB1 in the predetermined street 23 as shown in FIG. 6A. As a result, two cracks 211 are generated in the laminated member 21 by the thermal shock due to this heating in such a manner as to extend along the two parallel lines in the predetermined street 23 as shown in FIG. 6B. This first laser processing step is performed for all the streets 23 formed on the semiconductor wafer 2. In generating the cracks 211 in the laminated member 21 by performing the first laser processing step, it is important to set the energy intensity of the first laser beam LB1 to 7 to 8 J/cm$^2$. If the energy intensity of the first laser beam LB1 is lower than 7 J/cm$^2$, the temperature for heating the substrate 20 is low, so that it is difficult to generate the cracks 211 in the laminated member 21 by the thermal shock. Conversely, if the energy intensity of the first laser beam LB1 is higher than 8 J/cm$^2$, the temperature for heating the substrate 20 is high, so that the laminated member 21 may be peeled or fused.

Figure 7A:
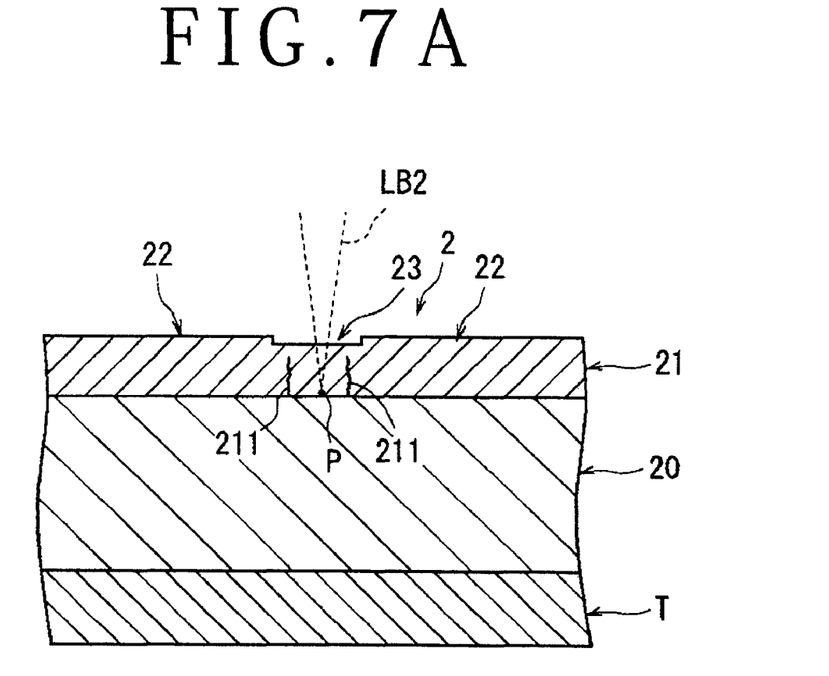
FIGS. 7A and 7B are enlarged sectional views of the wafer for illustrating a second laser processing step of the laminated member removing step.
Figure 7B:
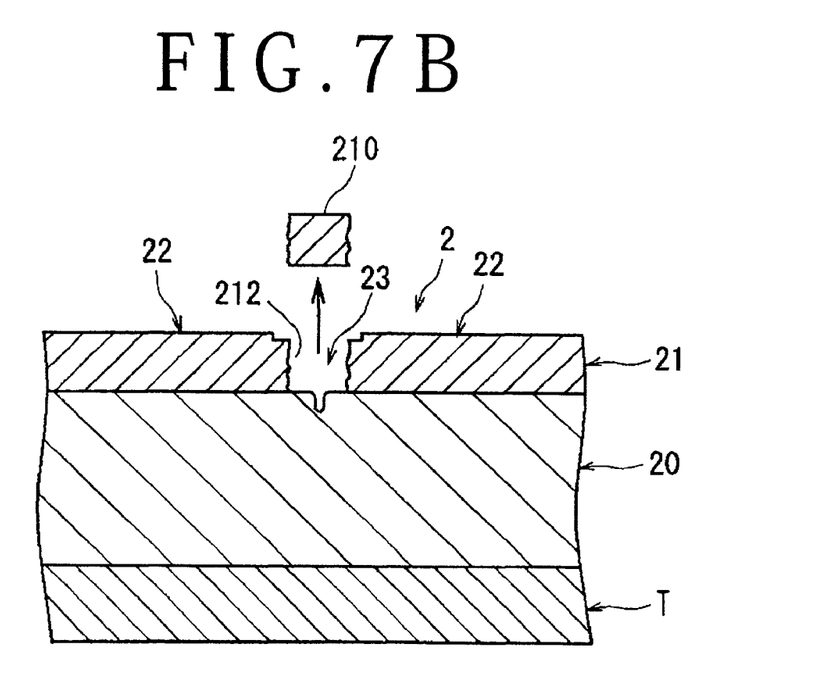

After finishing the first laser processing step for all the streets 23 formed on the semiconductor wafer 2, the second laser processing step is performed in such a manner that the second laser beam having an energy intensity higher than that of the first laser beam is applied to the region between the two cracks 211 in the laminated member 21, thereby removing the region between the two cracks 211 in the laminated member 21 to expose the substrate 20 along each street 23. This second laser processing step may be performed by using the laser processing unit 3 shown in FIG. 4. Accordingly, in the condition where the semiconductor wafer 2 is held on the chuck table 31 after finishing the first laser processing step, the second laser processing step may be performed by adjusting the power of the pulsed laser beam LB1. More specifically, as shown in FIG. 7A, the second laser processing step is performed in such a manner that a pulsed laser beam LB2 as the second laser beam is applied to the region between the two cracks 211 formed in the laminated member 21 and that the focal point P of the pulsed laser beam LB2 is adjusted near the upper surface of the substrate 20. As in the first laser processing step, the pulsed laser beam LB2 is applied along each street 23 from one end to the other end thereof.

For example, the second laser processing step mentioned above is performed under the following conditions.

| | |
|---|---|
| Light source of laser beam: | YAG laser |
| Wavelength: | 355 nm |
| Average power: | 3.0 W |
| Energy intensity per pulse: | 14 to 16 J/cm$^2$ |
| Repetition frequency: | 10 kHz |
| Focused spot (elliptical shape): | |
| Major axis: | 200 µm |
| Minor axis: | 10 µm |
| Work feed speed: | 200 mm/sec |

By performing the second laser processing step, the substrate 20 of the semiconductor wafer 2 is heated near the focal point P of the pulsed laser beam LB2 in each street 23 as shown in FIG. 7A. As a result, the laminated member 21 is cleaved along the two cracks 211 in each street 23 by the thermal shock due to this heating, and a fragment 210 caused by this cleavage is scattered. Accordingly, the region between the two cracks 211 in the laminated member 21 is removed to form a groove 212 extending along each street 23 and to accordingly expose the substrate 20 to this groove 212. In removing the region between the two cracks 211 in the laminated member 21 by performing the second laser processing step, it is important to set the energy intensity of the second laser beam LB2 to 14 to 16 J/cm$^2$. If the energy intensity of the second laser beam LB2 is lower than 14 J/cm$^2$, it is difficult to cleave the laminated member 21 along the two cracks 211 in each street 23 and to scatter the fragment 210. Conversely, if the energy intensity of the second laser beam LB2 is higher than 16 J/cm$^2$, there is a possibility that the laminated member 21 may be peeled in a region spreading beyond the two cracks 211 into the adjacent devices 22.

Figure 8:
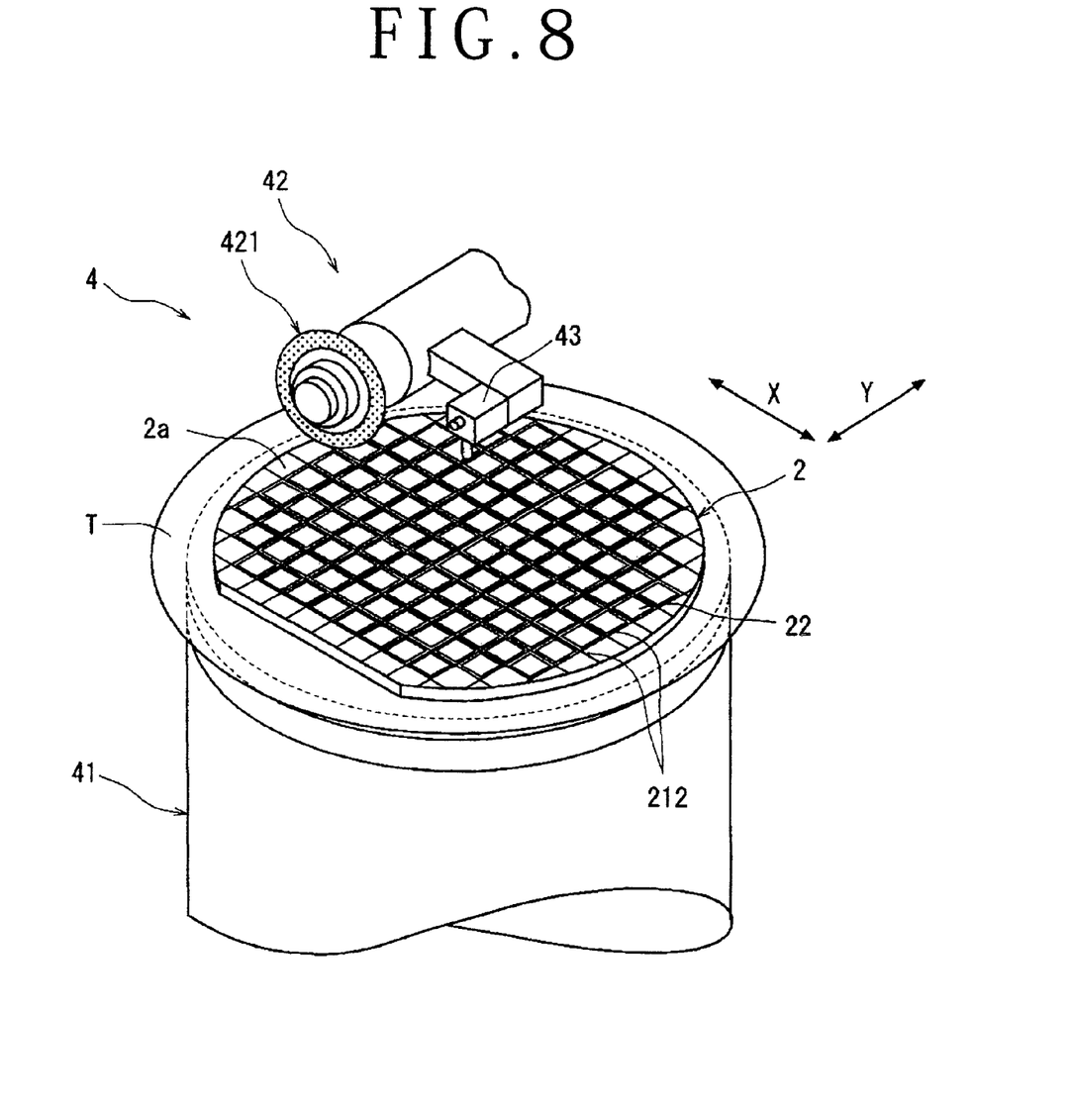
FIG. 8 is a perspective view of an essential part of a cutting unit for performing a first preferred embodiment of a cutting step in the wafer separating method according to the present invention.

After finishing the laminated member removing step composed of the first and second laser processing steps mentioned above, a cutting step is performed to cut the substrate 20 along each street 23 from which the laminated member 21 has been removed. A first preferred embodiment of this cutting step is performed by using a cutting unit 4 shown in FIG. 8. As shown in FIG. 8, the cutting unit 4 includes a chuck table 41 for holding a workpiece, cutting means 42 having a cutting blade 421 for cutting the workpiece held on the chuck table 41, and imaging means 43 for imaging the workpiece held on the chuck table 41. The chuck table 41 is so configured as to hold the workpiece by using suction means (not shown). The chuck table 41 is movable in a work feed direction shown by an arrow X and an index direction shown by an arrow Y by means of a moving mechanism (not shown). The cutting blade 421 is composed of a disk-shaped base and an annular cutting member mounted on the outer circumferential portion of a side surface of the base. The cutting member of the cutting blade 421 has a thickness (e.g., 20 µm) smaller than the width of the groove 212. The imaging means 43 includes an ordinary imaging device (CCD) for imaging a workpiece by using visible light. An image signal output from the imaging means 43 is transmitted to control means (not shown).

The cutting step using the cutting unit 4 is performed in the following manner. First, the semiconductor wafer 2 is placed on the chuck table 41 of the cutting unit 4. Thereafter, the suction means (not shown) is operated to hold the semiconductor wafer 2 on the chuck table 41 by vacuum. In this condition, the dicing tape T to which the lower surface 2b of the semiconductor wafer 2 is attached is placed on the chuck table 41. Accordingly, the semiconductor wafer 2 is held on the chuck table 41 in the condition where the upper surface 2a is exposed. In FIG. 8, the annular frame F for supporting the dicing tape T is not shown. Although not shown, the annular frame F is supported by suitable frame supporting means provided on the chuck table 41.

The chuck table 41 thus holding the semiconductor wafer 2 is moved to a position directly below the imaging means 43 by work feeding means (not shown). When the chuck table 41 is positioned directly below the imaging means 43, an alignment operation is performed by the imaging means 43 and the control means (not shown) to detect a subject area of the semiconductor wafer 2 to be cut by the cutting means 421. More specifically, the imaging means 43 and the control means (not shown) perform image processing such as pattern matching for making the alignment of the grooves 212 (streets 23) extending in a predetermined direction on the semiconductor wafer 2 and the cutting blade 421 for cutting the substrate 20 along the grooves 212 (streets 23), thus performing the alignment of a cutting position. Similarly, the alignment of a cutting position is performed for the other grooves 212 (streets 23) extending in a direction perpendicular to the above-mentioned predetermined direction on the semiconductor wafer 2.

Figure 9:
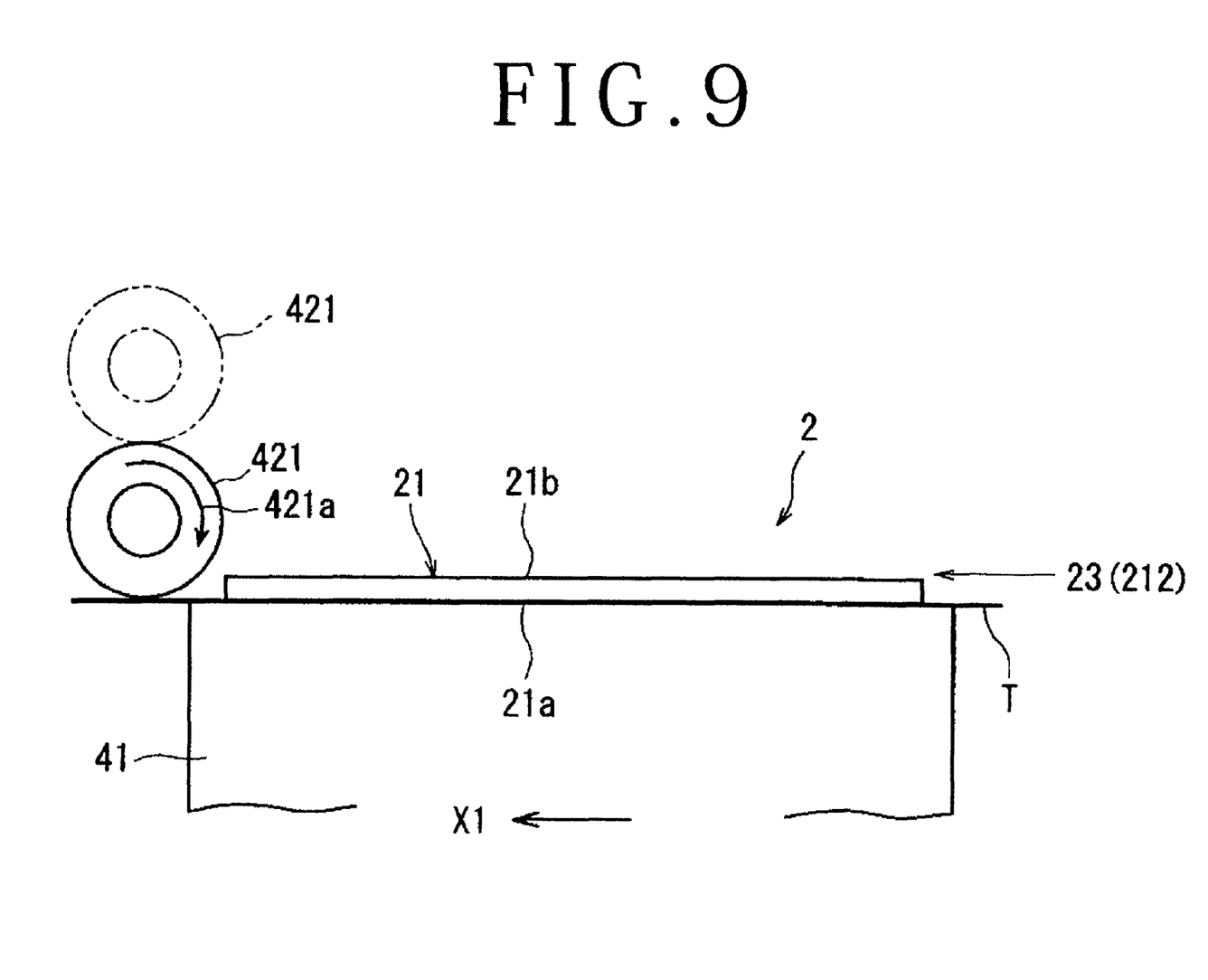
FIG. 9 is an elevational view showing the first preferred embodiment of the cutting step.
Figure 10A:
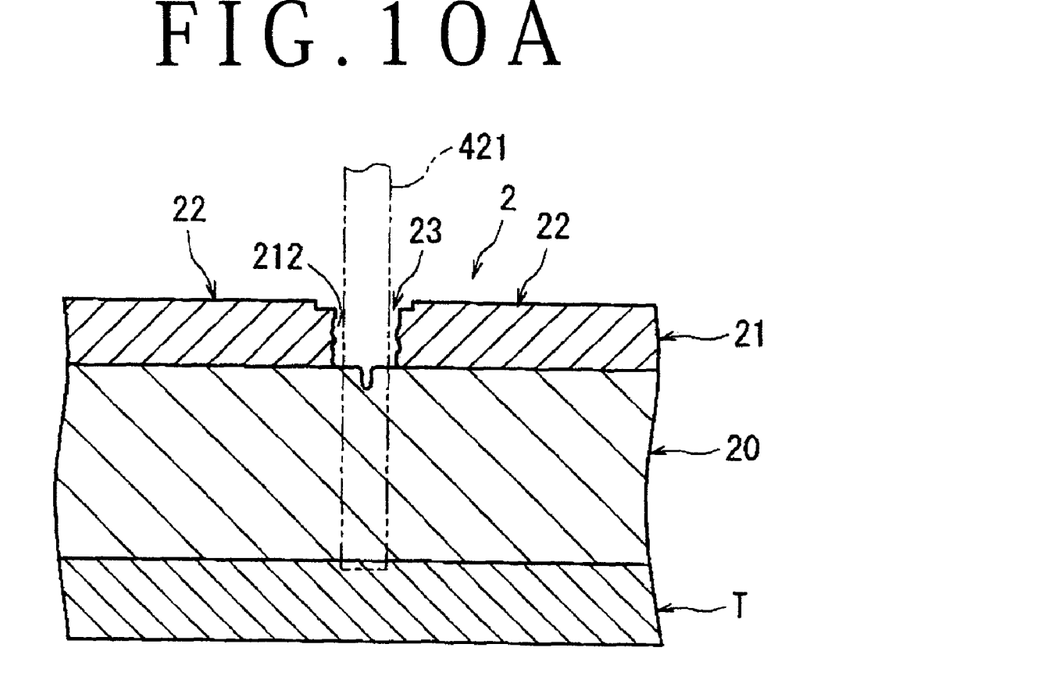
FIGS. 10A and 10B are enlarged sectional views of the wafer for illustrating the cutting step shown in FIG. 9.

After detecting the grooves 212 formed along the streets 23 of the semiconductor wafer 2 held on the chuck table 41 to perform the alignment of a cutting position, the chuck table 41 is moved to a cutting start position as shown in FIG. 9. At this time, one end of a predetermined one of the streets 23 (left end as viewed in FIG. 9) is positioned on the right side as viewed in FIG. 9 by a predetermined amount from a position directly below the cutting blade 421. In this condition, the cutting blade 421 is rotated at a predetermined speed in a direction shown by an arrow 421a in FIG. 9, and is vertically fed by a predetermined amount from a standby position shown by a phantom line in FIG. 9 to a lower limit position shown by a solid line in FIG. 9 by operating a vertical feed mechanism (not shown). This lower limit position is set to a position where the outer circumferential edge of the cutting blade 421 reaches the dicing tape T as shown in FIGS. 9 and 10A.

After vertically feeding the cutting blade 421 as mentioned above, the chuck table 41 is moved in a direction shown by an arrow X1 in FIG. 9 at a predetermined feed speed during rotation of the cutting blade 421 in the direction of the arrow 421a at the predetermined speed mentioned above. When the right end of the predetermined street 23 of the semiconductor wafer 2 held on the chuck table 41 as viewed in FIG. 9 has passed through a position directly below the cutting blade 421, the movement of the chuck table 41 is stopped.

For example, the cutting step using the cutting blade 421 mentioned above is performed under the following conditions.

| Cutting blade: | |
|---|---|
| Outer diameter: | 52 mm |
| Thickness: | 20 μm |
| Rotational speed of cutting blade: | 20000 rpm |
| Work feed speed: | 50 mm/sec |

Figure 10B:
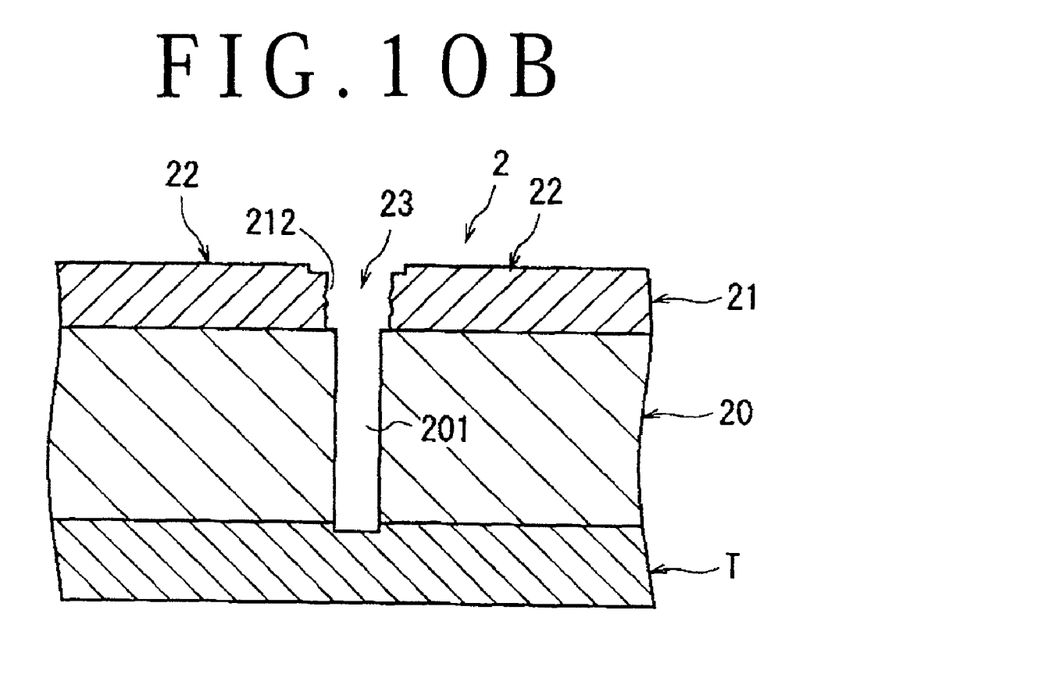

This cutting step is performed for all the grooves 212 formed along all the streets 23 on the semiconductor wafer 2. As a result, as shown in FIG. 10B, the substrate 20 of the semiconductor wafer 2 is cut along each groove 212 formed along each street 23 to thereby form a blade cut groove 201, thus separating the semiconductor wafer 2 into the individual devices 22.

Figure 11A:
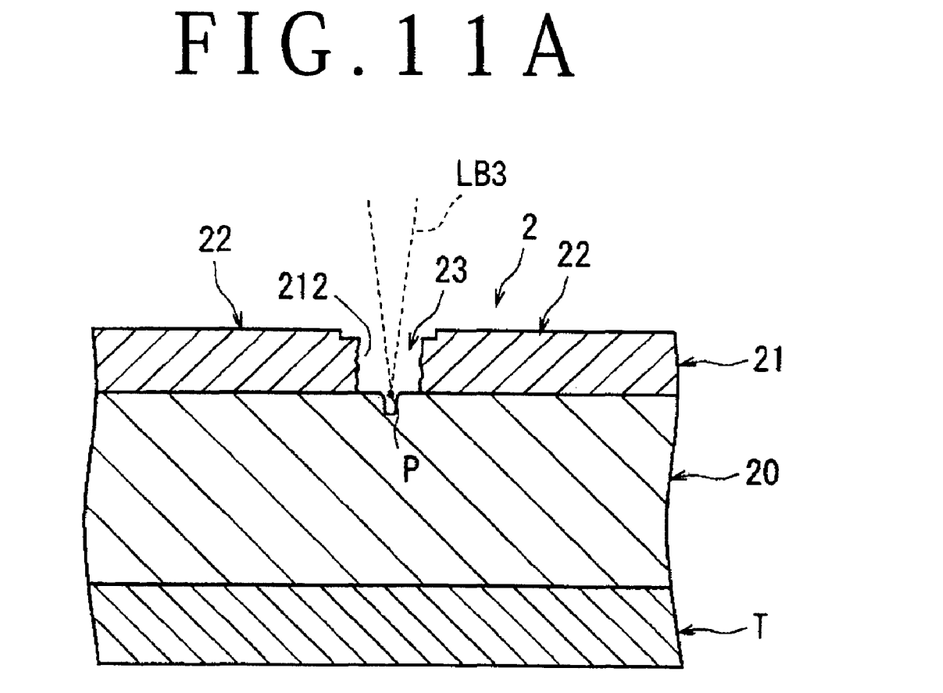
FIGS. 11A and 11B are enlarged sectional views of the wafer for illustrating a second preferred embodiment of the cutting step in the wafer separating method according to the present invention.
Figure 11B:
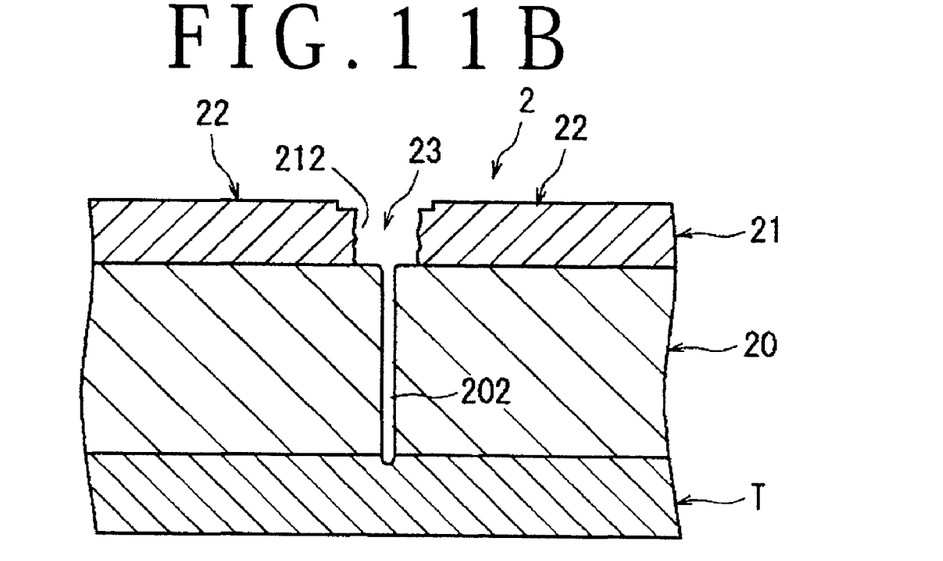

A second preferred embodiment of the cutting step for cutting the substrate 20 along each street 23 after the laminated member removing step will now be described. The second preferred embodiment of this cutting step may be performed by using the laser processing unit 3 shown in FIG. 4. Accordingly, after finishing the laminated member removing step composed of the first and second laser processing steps, the cutting step may be performed by adjusting the power of the pulsed laser beam LB2 in the condition where the semiconductor wafer 2 is held on the chuck table 31. More specifically, as shown in FIG. 11A, the cutting step is performed in such a manner that a pulsed laser beam LB3 as a third laser beam having an energy density higher than that of the second laser beam is applied to the exposed portion of the substrate 20 as exposed by removing the laminated member 21 and that the focal point P of the pulsed laser beam LB3 is adjusted near the upper surface of the substrate 20. The pulsed laser beam LB3 has an absorption wavelength corresponding to the substrate 20. As in the first laser processing step, the pulsed laser beam LB3 is applied along each groove 212 formed along each street 23 from one end to the other end thereof. As a result, as shown in FIG. 11B, the substrate 20 of the semiconductor wafer 2 is cut along each groove 212 formed along each street 23 to thereby form a laser cut groove 202.

For example, the cutting step using the pulsed laser beam LB3 mentioned above is performed under the following conditions.

| Light source of laser beam: | YAG laser |
|---|---|
| Wavelength: | 355 nm |
| Average power: | 5.0 W |
| Energy intensity per pulse: | 24 to 26 J/cm$^2$ |
| Repetition frequency: | 10 kHz |
| Focused spot (elliptical shape): | |
| Major axis: | 200 μm |
| Minor axis: | 10 μm |
| Work feed speed: | 200 mm/sec |

This cutting step is performed for all the grooves 212 formed along all the streets 23 on the semiconductor wafer 2. As a result, the substrate 20 of the semiconductor wafer 2 is cut along each groove 212 formed along each street 23, thereby separating the semiconductor wafer 2 into the individual devices 22. The laminated member 21 is cleaved along the two cracks 211 in each street 23, so that no laser processing strain remains in the laminated member 21 and the die strength of each device 22 is not reduced.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer separating method for separating a wafer along a plurality of streets to obtain a plurality of individual devices, said wafer being composed of a substrate and a laminated member formed on said substrate, said laminated member being composed of an insulating film and a functional film laminated on said insulating film, said wafer separating method comprising:

a laminated member removing step for partially removing said laminated member along said streets by applying a laser beam to said wafer along said streets; and a cutting step for cutting said substrate along said streets after said laminated member removing step;

said laminated member removing step including a first laser processing step for applying a first laser beam along two parallel lines spaced apart from each other in each street, said first laser beam being capable of passing through said laminated member and having an absorption wavelength corresponding to said substrate, thereby heating said substrate to generate two cracks in said laminated member by thermal shock so that said two cracks extend along said two parallel lines in each street and across a plurality of intersecting streets, without exposing the substrate, and a second laser processing step for applying a second laser beam to a region between said two cracks in said laminated member, said second laser beam having an energy intensity higher than that of said first laser beam, thereby removing said region between said two cracks in said laminated member to expose said substrate along each street, wherein the energy intensity of said first laser beam is set to 7 to 8 J/cm$^2$, and the energy intensity of said second laser beam is set to 14 to 16 J/cm$^2$;

said first laser beam along said two parallel lines is focused near the upper surface of said substrate above both edges of each street; and said second laser beam is focused near the upper surface of said substrate above a center of each street.

2. The wafer separating method according to claim 1, wherein:

said insulating film is formed of a vitreous material selected from the group consisting of SiO$_2$, SiO, and SiN;

said substrate is formed of Si or GaAs; and the wavelength of said first laser beam is set to 355 nm.

3. The wafer separating method according to claim 1, wherein said cutting step uses a cutting blade having a thickness smaller than the width of an exposed portion of said substrate exposed along each street by said second laser processing step, whereby said exposed portion of said substrate is cut by said cutting blade along each street.

4. The wafer separating method according to claim 1, wherein said cutting step uses a third laser beam having an energy intensity higher than that of said second laser beam, said third laser beam being applied to an exposed portion of said substrate exposed along each street by said second laser processing step, whereby said exposed portion of said substrate is cut by said third laser beam along each street.

5. The wafer separating method according to claim 4, wherein the energy intensity of said third laser beam is set to 24 to 26 J/cm$^2$.

6. A wafer separating method for separating a wafer along a plurality of streets to obtain a plurality of individual devices, said wafer being composed of a substrate and a laminated member formed on said substrate, said laminated member being composed of an insulating film and a functional film laminated on said insulating film, said wafer separating method comprising:

a laminated member removing step for partially removing said laminated member along said streets by applying a laser beam to said wafer along said streets; and     a cutting step for cutting said substrate along said streets after said laminated member removing step;

said laminated member removing step including a first laser processing step for applying a first laser beam indexed along each street and which is focused at focal points along two parallel lines spaced apart from each other in each street, said first laser beam being capable of passing through said laminated member and having an absorption wavelength corresponding to said substrate, thereby heating said substrate to generate two cracks in said laminated member by thermal shock so that said two cracks extend along said two parallel lines in each street and across a plurality of intersecting streets, without exposing the substrate, and         a second laser processing step for applying a second laser beam indexed along each street to a region between said two cracks in said laminated member, said second laser beam having an energy intensity higher than that of said first laser beam, thereby removing said region between said two cracks in said laminated member to expose said substrate along each street, wherein said second laser beam is focused at a focal point centrally between the focal points where the first laser beam is focused;

said first laser beam along said two parallel lines is focused near the upper surface of said substrate above both edges of each street; and said second laser beam is focused near the upper surface of said substrate above a center of each street.

\* \* \* \* \*